(12) United States Patent
Jeong (10) Patent No.: US 9,147,479 B2
(45) Date of Patent: Sep. 29, 2015

(54) MEMORY SYSTEM AND METHOD FOR OPERATING THE SAME

(71) Applicant: SK hynix Inc., Gyeonggi-do (KR)

(72) Inventor: Yeon Joo Jeong, Gyeongsangbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/243,646

(22) Filed: Apr. 2, 2014

(65) Prior Publication Data

US 2015/0187426 A1   Jul. 2, 2015

(30) Foreign Application Priority Data

Dec. 26, 2013   (KR) .......................... 10-2013-0164278

(51) Int. Cl.
*G11C 16/04*   (2006.01)
*G11C 16/16*   (2006.01)

(52) U.S. Cl.
CPC ..................................... *G11C 16/16* (2013.01)

(58) Field of Classification Search
CPC ............. G11C 16/3404; G11C 16/349; G11C 2211/5641; G11C 29/82; G11C 16/14; G11C 16/3445; G11C 16/3495
USPC ............. 365/185.29, 185.09, 185.22, 185.23, 365/189.011, 230.03
See application file for complete search history.

(56) References Cited

U.S. PATENT DOCUMENTS

2014/0269090 A1*   9/2014   Flynn et al. ............... 365/185.19

FOREIGN PATENT DOCUMENTS

KR   101060799   8/2011

* cited by examiner

*Primary Examiner* — Thong Q Le
(74) *Attorney, Agent, or Firm* — IP & T Group LLP (57) ABSTRACT

A memory system and a method for operating the same are provided. The memory system includes a semiconductor memory device suitable for performing an erase operation in response to a control signal, and if an erase command is input from a host, a controller suitable for temporarily storing erase block information according the erase command, and when a program command is input after the erase command is input, transmitting the control signal according to the erase command to the semiconductor memory device.

16 Claims, 6 Drawing Sheets

MEMORY SYSTEM AND METHOD FOR OPERATING THE SAME

CROSS-REFERENCE TO RELATED APPLICATION

The present application claims priority to Korean patent application number 10-2013-0164278 filed on Dec. 26, 2013, the entire disclosure of which is incorporated by reference herein.

BACKGROUND

1. Technical Field

Various embodiments of the present invention relate to an electronic device, and more specifically, to a memory system and a method for operating the same.

2. Related Art

Semiconductor memory devices are mainly categorized into volatile memory devices and non-volatile memory devices.

The volatile memory device is fast during write and read operations, but when power is interrupted stored data is lost. The non-volatile memory device is slow performing write and read operations when compared to the volatile memory device, but it retains its data even when power is interrupted. Therefore, the non-volatile memory device is used to store data required to be retained regardless of whether or not power is on. Examples of the non-volatile memory device include a read only memory (ROM), a mask ROM (MROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM) etc. The flash memory is divided into a NOR type flash memory and a NAND type flash memory.

The flash memory has the strengths of the RAM, easy programming and erasing data, as well as the strengths of the ROM, retaining stored data when power is interrupted. The flash memory is used as a storage medium for portable electronic devices, such as digital cameras, personal digital assistants (PDA), and MP3 players.

When an erase command is input from a user, the flash memory may instantly perform an erase operation. Alternatively, when an erase command is input while the flash memory is performing another operation, the flash memory performs an erase operation after completing the other operation. Thereafter, when a program command is input from the user, a program operation is performed on the memory block having the completed erase operation.

After completion of the erase operation, if the program operation takes a long time then the retention characteristics of the memory cells included in a memory block during an erase state are lowered so that threshold voltages are shifted upward, and thus the erase distribution characteristics may be degraded.

SUMMARY

Various embodiments of the present invention are directed to a memory system capable of preventing degradation of the erase distribution characteristics caused by upward shift of a threshold voltage due to degradation of the retention characteristics that may be generated after an erase operation of a semiconductor memory device, and a method for operating the same.

An embodiment of the present invention provides a memory system including a semiconductor memory device and a controller. The semiconductor memory device may perform an erase operation in response to a control signal. If an erase command is input from a host, the controller may temporarily store erase block information according to the erase command, and when a program command is input after the erase command is input, transmit the control signal to the semiconductor memory device according to the erase command.

An embodiment of the present invention provides a memory system including a semiconductor memory device and a controller. The semiconductor memory device may perform an erase operation in response to a control signal. When an erase command is input from a host, the controller may temporarily store erase block information according to the erase command, and if the number of erase blocks involved in the erase block information is larger than a predetermined number then perform the erase operation, and if the lumber of erase blocks involved in the erase block information is smaller than the predetermined number then keep the erase operation on hold.

An embodiment of the present invention provides a method of operating a memory system, the method including receiving an erase command from a host, storing erase block information according to the erase command, receiving a program command from the host, performing an erase operation according to the erase block information, and performing a program operation after the erase operation is completed.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

The present invention will be described with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the technical aspect of the present invention to those skilled in the art.

In the description of the present invention, it is understood that when a part is referred to as being "connected" to another part, it can be "directly connected" to the other part or "indirectly connected" to the other part with intervening one or more elements therebetween. In the description of the present invention, it is understood that when a part includes/comprises an element, another element is not excluded but further included as long as an opposite statement is not made.

Figure 1:
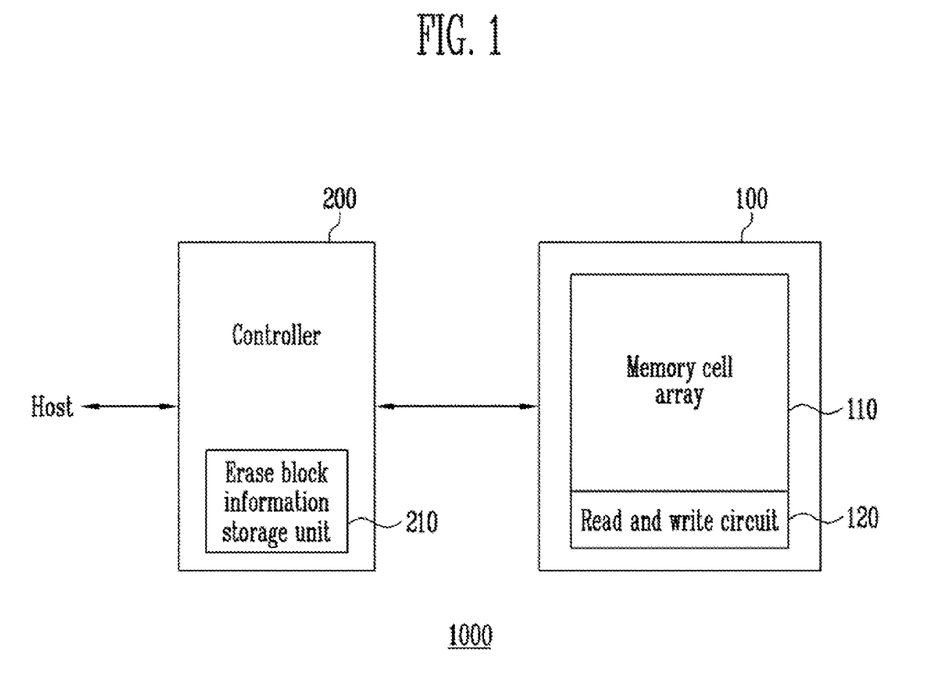
FIG. 1. is a block diagram illustrating a semiconductor memory device and a memory system including the semiconductor memory device according to an exemplary embodiment of the present invention.

FIG. 1 is a block diagram illustrating a memory system including a semiconductor memory device according to an exemplary embodiment of the present invention.

Referring to FIG. 1, a memory system 1000 includes a semiconductor memory device 100 and a controller 200. The semiconductor memory device 100 includes a memory cell array 110 and a read and write circuit 120 connected to the memory cell array 110.

The memory cell array 110 includes a plurality of memory cells. Each of the plurality of memory cells may be defined as a multi-level memory cell storing two or more data bits.

The semiconductor memory device 100 operates in response to control by the controller 200. Upon receiving an erase command from the controller 200, the semiconductor memory device 100 may perform an erase operation on memory cells indicated by an address that is received together with the erase command. Additionally, upon receiving a program command from the controller 200, the semiconductor memory device 100 may perform a program operation on memory cells indicated by an address that is received with the program command.

According to an exemplary embodiment of the present invention, the semiconductor memory device 100 may be a flash memory device. However, the technical aspect of the present invention is not limited to a flash memory device.

The controller 200 is connected between the semiconductor memory device 100 and a host Host. The controller 200 interfaces between the host Host and the semiconductor memory device 100. For example, during an erase or program operation according to a request from the host Host, the controller 200 may convert a logical block address received from the host Host into a physical block address, and provide the semiconductor memory device 100 with the converted physical block address together with a corresponding command. Additionally, when an erase command is input from the host Host, the controller 200 does not instantly transmit the erase command to the semiconductor memory device 100, but stores erase block information, such as an erase block address, which is input together with the erase command, in an erase block information storage unit 210. Thereafter, when a program command is input from the host Host, the controller 200 compares program block information, such as a program block address, which are input together with the program command, with the erase block information stored in the erase block information storage unit 210. If a block address involved in the erase block information is identical to a block address involved in the program block information, the controller 200 transmits the erase command to the semiconductor memory device 100 such that the erase operation is performed on the corresponding block before the program operation is performed.

To perform the program operation, the controller 200 transmits the program command to the semiconductor memory device 100 after the erase operation of the semiconductor memory device 100 is completed. That is, when an erase command is input from the host Host, the controller 200 temporarily holds performing the erase operation of the semiconductor memory device 100, and when a program command is input, cancels the hold of the erase operation and controls the semiconductor memory device 100 to perform the erase operation, and after the erase operation is completed, performs the program operation. In this manner, the erase operation and the program operation are sequentially performed thereby shortening the time taken until the program operation is performed after completion of the erase operation. Accordingly, the degradation of the retention characteristics of the memory cells, is prevented.

According to an exemplary embodiment, the controller 200 includes an erase block information storage unit 210. The erase block information storage unit 210 stores erase block information, such as an erase block address, when an erase command is input from the host Host. Additionally, the erase block information storage unit 210 compares program block information with the erase block information when a program command is input from the host Host. If the program block information has the same block address as that of the erase block information, the erase block information storage unit 210 controls transmission of the erase command for the corresponding block to the semiconductor memory device 100, FIG. 2 is a detailed block diagram of the semiconductor memory device 100.

Figure 2:
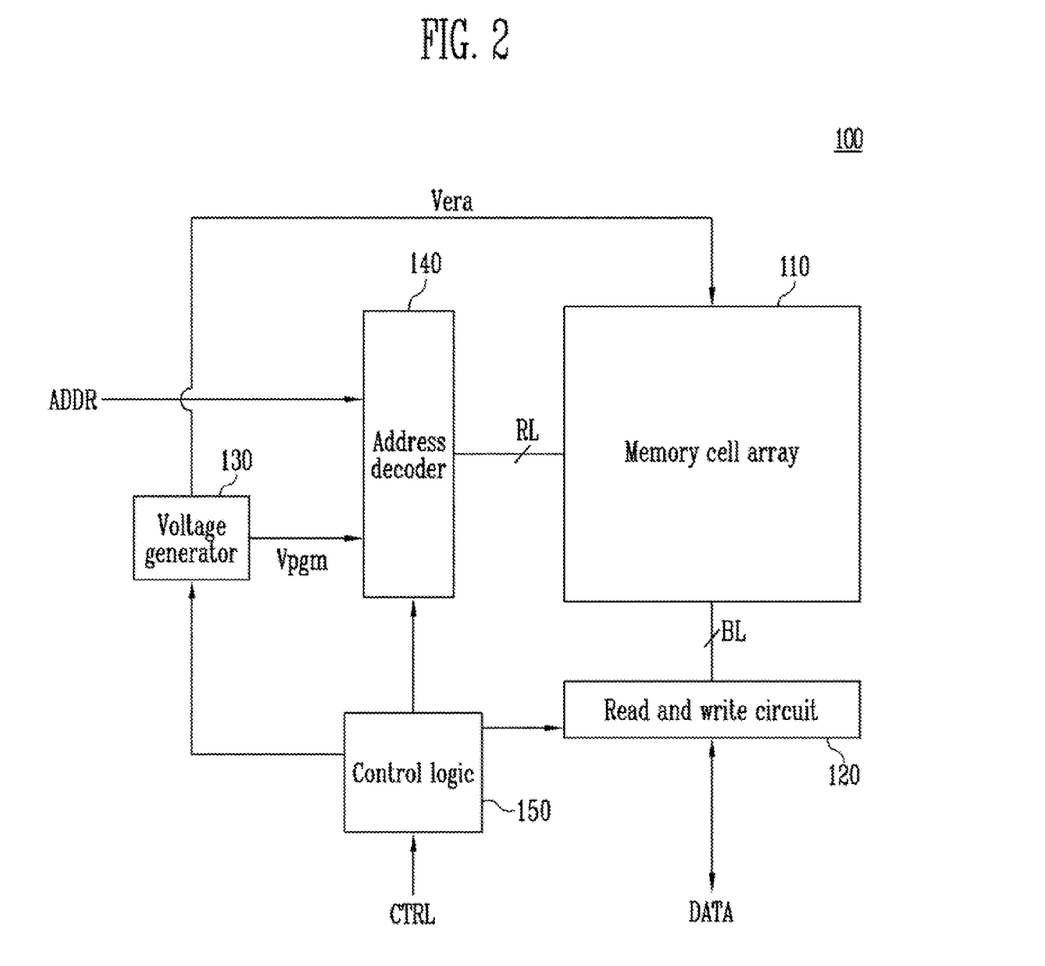
FIG. 2 is a detailed block diagram illustrating the semiconductor memory device.

Referring to FIG. 2, the semiconductor memory device 100 includes the memory cell array 110, an address decoder 140, a voltage generator 130, the read and write circuit 120, and a control logic 150.

The memory cell array 110 is connected to the read and write circuit 120 through bit lines BL. The memory cell array 110 is connected to the address decoder 140 through row lines RL.

The memory cell array 110 includes a plurality of memory blocks. Each of the memory blocks includes a plurality of cell strings. According to an exemplary embodiment, the plurality of memory cells may be non-volatile memory cells. According to an exemplary embodiment, each of the plurality of memory cells may be defined as a single level cell or a multi level cell.

The read and write circuit 120 is connected to the memory cell array 110 through the bit lines BL. The read and write circuit 120 operates in response to control of the control logic 150.

During an erase operation, the read and write circuit 120 may float the bit lines BL. During a program operation and a read operation, the read and write circuit 120 may perform communication of data DATA with an input/output buffer (not shown) inside the semiconductor memory device 100 or with the outside.

According to an exemplary embodiment of the present invention, the read and write circuit 120 may include page buffers (or page registers) and a column select circuit.

The voltage generator 130 may generate a plurality of voltages by use of an external voltage supplied to the semiconductor memory device 100. The voltage generator 130 operates in response to the control of the control logic 150.

According to an exemplary embodiment of the present invention, the voltage generator 130 may include a circuit that generates a voltage for a power source by regulating an external voltage. For example, the voltage generator 130 includes a plurality of pumping capacitors, and generates a plurality of voltages by selectively activating the plurality of pumping capacitors. During an erase operation, the voltage generator 130, generates an erase voltage Vera, and applies the generated erase voltage Vera to the memory cell array 110. During a program operation, the voltage generator 130 generates a program voltage Vpgm and applies the generated program voltage Vpgm to the address decoder 140.

The address decoder 140 is connected to the memory cell array 110 through the row lines RL. The row lines RL include drain select lines, word lines, source select lines, and common source lines The address decoder 140 may drive the row lines RL in response to the control of the control logic 150. The address decoder 140 receives an address ADDR from the input/output buffer (not shown) inside the semiconductor memory device 100 or from the outside.

During an erase operation, the address decoder 140 may float a plurality of row lines RL of the memory cell array 110 or apply an operating voltage generated by the voltage generator 130 to the plurality of row lines RL, and during a program operation, the address decoder 140 may apply a plurality of operating voltages including a program voltage Vpgm to the plurality of row lines RL.

The erase operation of the semiconductor memory device 100 is performed in units of memory blocks, That is, when an erase operation is performed, the address ADDR includes a block address. The address decoder 140 decodes the block address. The address decoder 140 selects at least one memory block according to a decoded block address when an erase voltage Vera is applied to the memory cell array 110. As row lines RL connected to the selected memory block are controlled, data of memory cells included in the selected memory block is erased.

The address decoder 140 may include a block decoder, a row decoder, and an address buffer.

The control logic 150 is connected to the read and write circuit 120, the voltage generator 130, and the address decoder 140. The control logic 150 receives a control signal CTRL from the controller (200 in FIG. 1). The control logic 150 controls the overall operation of the semiconductor memory device 100, for example, an erase operation or a program operation, in response to the control signal CTRL, The semiconductor memory device 100 may further include the input/output buffer (not shown). The input/output buffer receives a control signal CTRL and an address ADDR from the controller (200 in FIG. 1), and transmits the received control signal CTRL and address ADDR to the control logic 150 and address decoder 140, respectively. Additionally, the input/output buffer may transmit data DATA of the outside to the read and write circuit 120, and transmit data DATA of the read and write circuit 120 to the outside.

According to an exemplary embodiment of the present invention, the semiconductor memory device 100 may be a flash memory device.

The controller (200 in FIG. 1) according to an exemplary embodiment of the present invention is illustrated as including the erase block information storage unit 210, although the present invention is not limited thereto. For example, the erase block information storage unit 210 may be included in the control logic (150 in FIG. 2). When the erase block information storage unit 210 is included in the control logic (150 in FIG. 2), the controller 200 upon receiving an erase command from the host Host, sends the control logic 150 a command according to the erase command as a control signal CTRL, and the control logic 150 stores erase block information in the erase block information storage unit 210 according to the control signal CTRL. Thereafter, the controller 200 upon receiving a program command from the host Host, sends the control logic 150 a command according to the program command as a control signal CTRL, and the control logic 150 compares program block information with the erase block information stored in the erase block information storage unit 210 according to the control signal CTRL, and if a block address involved in the erase block information is the same as a block address involved in the program block information, controls the semiconductor memory device 100 to perform an erase operation on the corresponding block, and after the erase operation is completed, controls the semiconductor memory device 100 to perform a program operation on the corresponding block.

Figure 3:
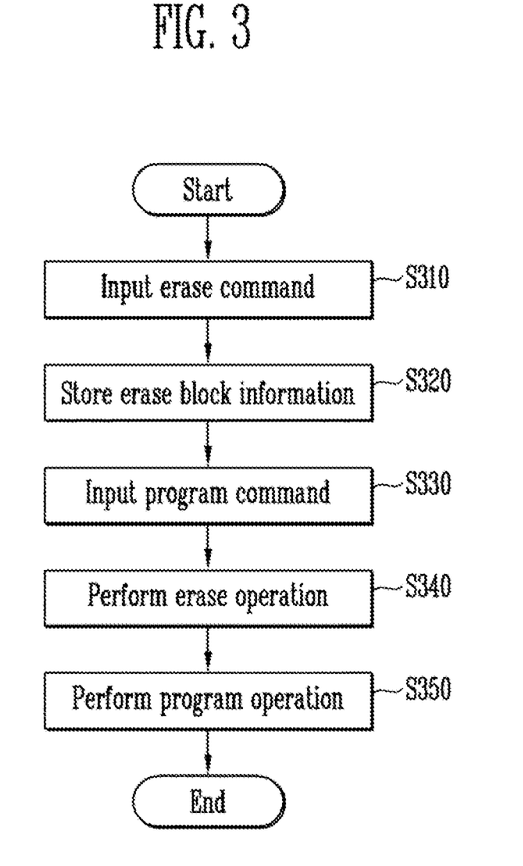
FIG. 3 is a flowchart illustrating an operation of the memory system according to an exemplary embodiment of the present invention.

FIG. 3 is a flowchart illustrating an operation of the memory system according to an exemplary embodiment of the present invention.

Hereinafter, an operation of the memory system including the semiconductor memory device according to the present invention will be described with reference to FIGS. 1 and 3.

First, an erase command is input from the host Host to the controller 200 (S310). The controller 200, upon receiving the erase command, stores erase block information in the erase block information storage unit 210 (S320). The erase block information includes an address of an erase block.

If a program command is input after a predetermined time from the input of the erase command (S330), the controller 200 compares an address of a program block that is input together with the program command with an address of an erase block of the erase block information stored in the erase block information storage unit 210. If the address of the erase block is the same as the address of the program block, the controller 200 sends the control logic 150 a control signal CTRL to perform an erase operation of the semiconductor memory device 100.

The control logic 150 controls the read and write circuit 120, the voltage generator 130, and the address decoder 140 to perform an erase operation of the corresponding memory block according to the control signal CTRL (S340).

When the erase operation of the semiconductor memory device 100 is completed, the controller 200 sends the control logic 150 a control signal CTRL according to the program command. The control logic 150 controls the read and write circuit 120 the voltage generator 130, and the address decoder 140 to perform a program operation of the corresponding memory block according to the control signal CTRL (S350).

According to the exemplary embodiment of the present invention described above, when an erase command is input from the host Host, a control signal according to the erase command is not instantly transmitted to the semiconductor memory device 100, but the erase block information, such as an erase block address which is input together with the erase command, is stored in the erase block information storage unit 210. When a program command is input from the host Host, program block information, such as a program block address which is input together with the program command, is compared with the erase block information stored in the erase block information storage unit 210, and if a block address involved in the program block information is the same as a block address involved in the erase block information, a control signal CTRL is transmitted to the semiconductor memory device 100 to control the semiconductor memory device 100 to perform an erase operation on the corresponding block prior to a program operation.

After the erase operation is completed, the controller 200 transmits a control signal CTRL according to the program command to the semiconductor memory device 100 to control the semiconductor memory device 100 to perform the program operation. That is, when an erase command is input from the host Host, the controller 200 temporarily keeps an erase operation of the semiconductor memory device 100 on hold, and when a program command is input, cancels the hold of the erase operation and controls the semiconductor memory device 100 to perform the erase operation, and when the erase operation is completed to perform a program operation. In this manner, the erase operation and the program operation are sequentially performed and the time taken until the program operation is performed after the erase operation is completed is shortened. Accordingly, the degradation of the retention characteristics of the memory cells is prevented.

Figure 4:
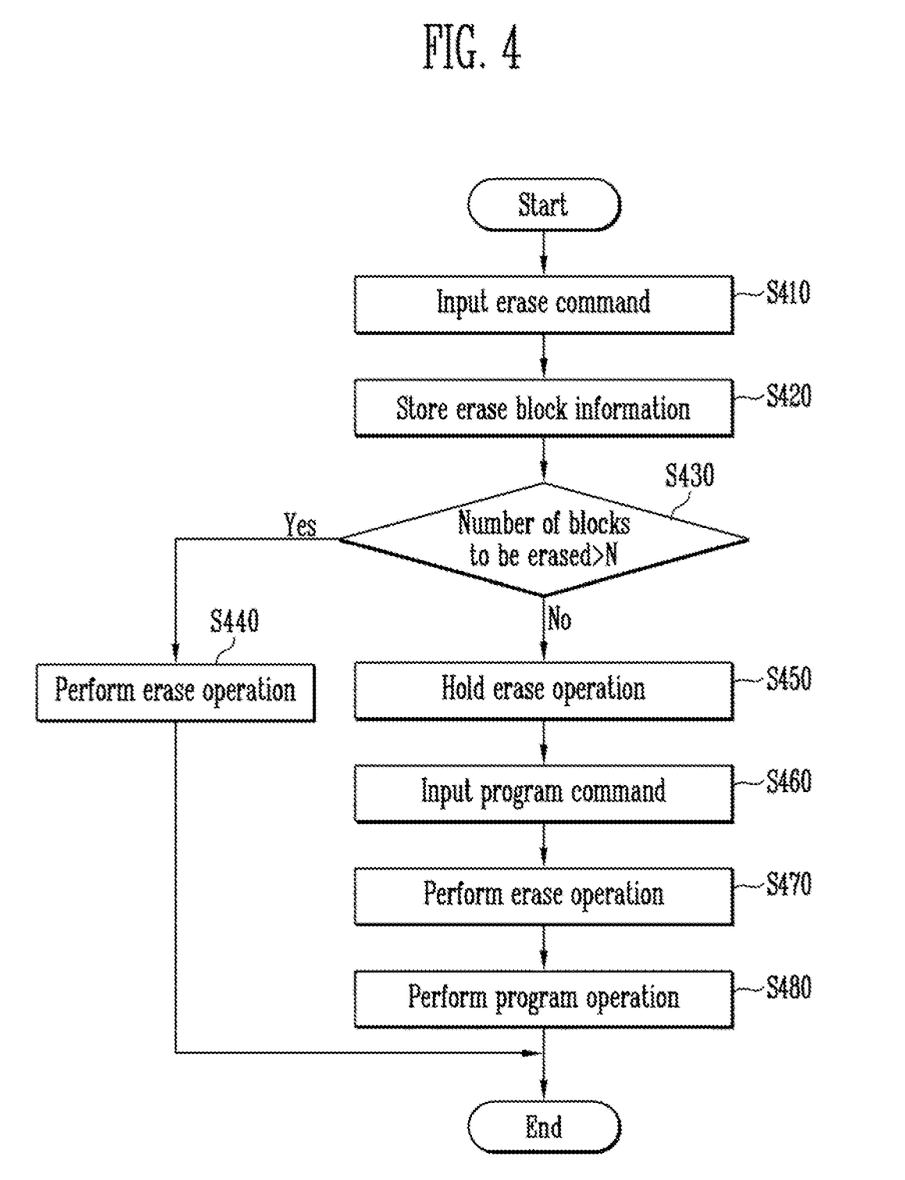
FIG. 4 is a flowchart illustrating an operation of a memory system according to another exemplary embodiment of the present invention.

FIG. 4 is a flowchart illustrating an operation of a memory system according to another exemplary embodiment of the present invention.

Hereinafter, an operation of a memory system including a semiconductor memory device according to the present invention v rill be described with reference to FIGS. 1, 2, and 4.

First, an erase command is input from the controller 200 (S410). When the erase command is input, the controller 200, stores erase block information in the erase block information storage unit 210 (S420). The erase block information includes addresses of erase blocks and the number of the erase blocks.

Based on the erase block information stored in the erase block information storage unit 210, the number of blocks to be erased is compared with a predetermined block number N (S430). If the number of the blocks to be erased is larger than the predetermined block number N, the controller 200 transmits the addresses of erase blocks and a control signal CTRL corresponding to the erase command to the semiconductor memory device 100, thereby controlling the semiconductor memory device 100 to perform an erase operation. (S440).

If the number of the blocks to be erased is smaller than the predetermined block number N, an erase operation according to the input erase command is kept on hold (S450).

When a program command is input from the host Host when the erase operation is on hold (S460), the controller 200 compares an address of a program block that is input together with the program command with the address of the erase block among the erase block information stored in the erase block information storage unit 210. If the address of the program block is the same as the address of the erase block the controller 200 sends the control logic 150 a control signal CTRL to perform an erase operation of the semiconductor memory device 100. The control logic 150 performs an erase operation by controlling the read and write circuit 120, the voltage generator 130 and the address decoder 140 to perform an erase operation of the corresponding memory block according to the control signal CTRL (S470).

When the erase operation of the semiconductor memory device 100 is completed, the controller 200 sends the control logic 150 a control signal CTRL according to the program command. The control logic 150 performs a program operation by controlling the read and write circuit 120, the voltage generator 130, and the address decoder 140 to perform a program operation of the corresponding memory block according to the control signal CTRL (S480).

According to the exemplary embodiment of the present invention described above, the controller 200 holds an erase operation before the number of blocks to be erased is larger than a predetermined number, and once the number of blocks to be erased becomes larger than the predetermined number, performs the erase operation. Additionally, if a program command is input while the erase operation is kept on hold, a program operation is performed after performing the erase operation having been kept on hold, thereby preventing the degradation of the retention characteristics of the memory cells.

Figure 5:
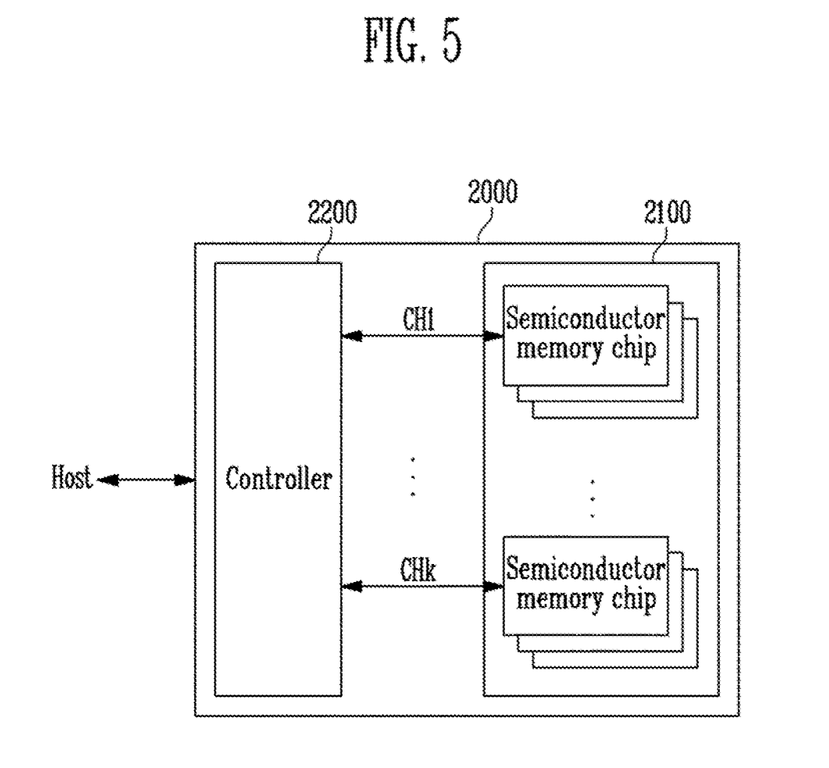
FIG. 5 is a block diagram illustrating an example of application of the memory system of FIG. 1.

FIG. 5 is a block diagram illustrating an example of application of the memory system of FIG. 1.

Referring to FIG. 5, a memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 5, the plurality of groups illustrated as communicating with the controller 2200 through a first channel to a $k^{th}$ channel CH1 to CHk. Each of the semiconductor memory chips has the same configuration and operates in the same manner as the semiconductor memory device 100 described above with reference to FIG. 1.

Each of the groups communicates with the controller 2200 through a single common channel. The controller 2200 has the same configuration and operates in the same manner as the controller 200 described above with reference to FIG. 1. The controller 2200 controls the plurality of memory chips of the semiconductor memory device 2100 through the plurality of channels CH1 to CHk.

Figure 6:
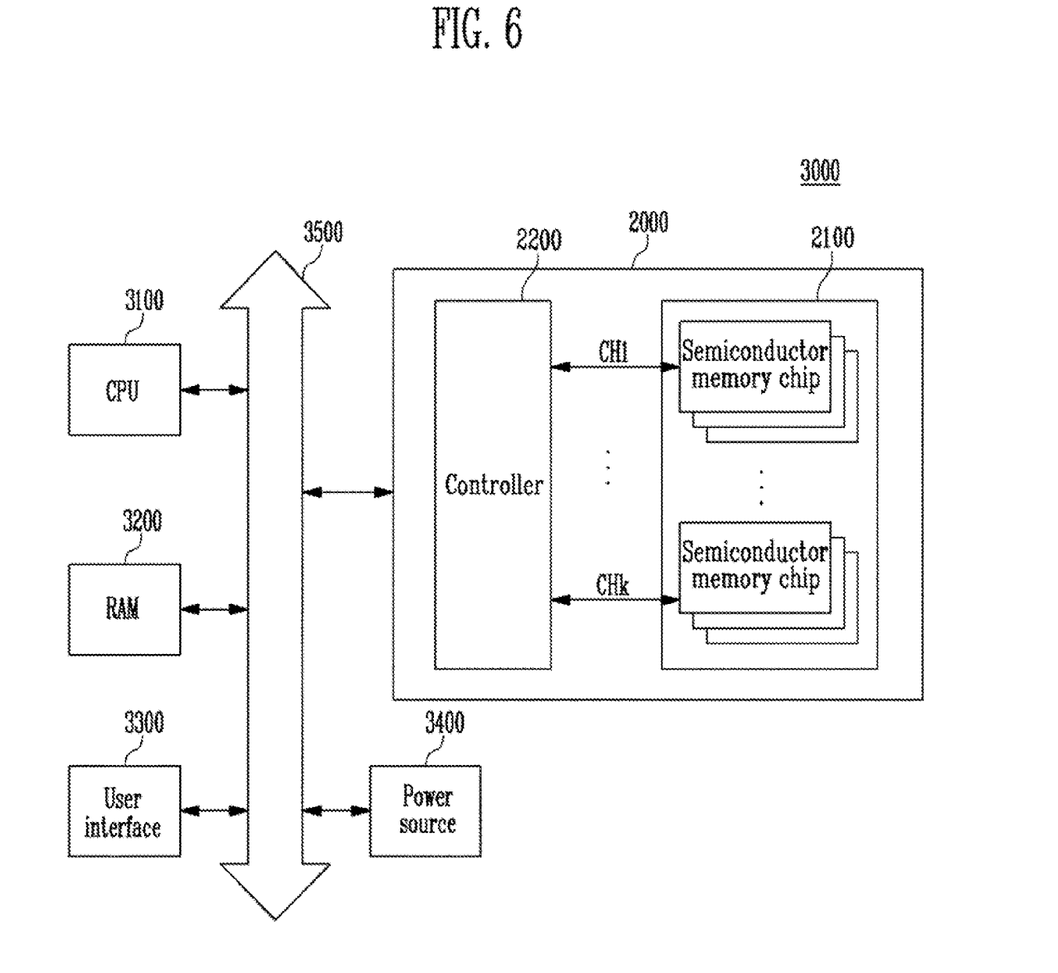
FIG. 6 is a block diagram illustrating a computing system including the memory system described with reference to FIG. 5.

FIG. 6 is a block diagram illustrating a computing system including the memory system described with reference to FIG. 5.

Referring to FIG. 6, a computing system 3000 includes a central processing unit (CPU) 3100, a random access memory (RAM) 3200, a user interface 3300, a power source 3400, a system bus 3500, and the memory system 2000.

The memory system 2000 is electrically connected to the CPU 3100, the RAM 3200, the user interface 3300, and the power source 3400 through the system bus 3500. Data provided through the user interface 3300 or processed by the CPU 3100 is stored in the memory system 2000.

Although the semiconductor memory device 2100 is illustrated in FIG. 6 as being connected to the system bus 3500 through the controller 2200, the semiconductor memory device 2100 may be configured to be directly connected to the system bus 3500. In this case, the function of the controller 2200 may be performed by the CPU 3100 and the RAM 3200.

Although the memory system 2000 shown in FIG. 6 is provided as the illustration of FIG. 5, the memory system 2000 may be substituted with the memory system 1000 shown in FIG. 1. According to an exemplary embodiment of the present invention, the computing system 3000 may include both the memory systems 1000 and 2000 described with reference to FIGS. 1 and 5.

According to an embodiment of the present invention, when an erase command is input to perform an erase operation of the semiconductor memory device, the erase operation is kept on hold until a program command is input. Upon receiving the program command, the erase operation is instantly performed before the program operation is performed, thereby preventing the degradation of retention characteristics of memory cells until the start of the program operation after the erase operation.

In the drawings and specification, there have been disclosed typical exemplary embodiments of the present invention and, although specific terms are employed, they are used in a generic and descriptive sense only and not for purposes of limitation. As for the scope of the present invention, it is to be set forth in the following claims. Therefore, it will be understood by those of ordinary skill in the art, that various changes in form and details may be made therein without departing from the spirit and scope of the present invention as defined by the following claims.

What is claimed is:

1. A memory system comprising
    a semiconductor memory device configured to perform an erase operation in response to a control signal for the erase operation; and
    a controller configured to receive an erase operation request and an erase block address corresponding to the erase request from a host, store the erase block address, and transmit the control signal for the erase operation to the semiconductor memory device when a program operation request corresponding to the erase block address is received.

2. The memory system of claim 1, wherein the controller further configured to control the semiconductor memory device to perform a program operation after the semiconductor memory device completes the erase operation according to the control signal for the erase operation.

3. The memory system of claim 1, wherein the controller includes an erase block information storage unit to temporarily store the erase block address.

4. The memory system of claim 1, wherein the semiconductor memory device comprises:
a memory cell array having a plurality of memory cells; and
a control logic configured to control the erase operation of the memory cell array.

5. The memory system of claim 3, wherein the controller further configured to compare the erase block address stored in the erase block information storage unit with a program block address received with the program operation request, and when a block involved in the program block address is same as a block involved in the erase block address, transmits the control signal to the semiconductor memory device.

6. A memory system comprising:
a semiconductor memory device configured to perform an erase operation in response to a control signal for an erase operation; and
a controller configured to receive a plurality of erase operation requests and a plurality of erase block addresses corresponding to the erase operation request respectively and temporarily store the plurality of erase block address and transmit the control signal for the erase operation when the number of erase blocks corresponding to the plurality of erase block addresses is larger than a predetermined number.

7. The memory system of claim 6, wherein the controller further configured to transmit the control signal for the erase operation when a program operation request corresponding to any one of the plurality of erase block addresses is received from the host.

8. The memory system of claim 6, wherein the controller further configured to keep the transmission of the control signal for the erase operation on hold when the number of the erase blocks corresponding to the plurality of erase block addresses is smaller than the predetermined number.

9. The memory system of claim 6, wherein the controller comprises an erase block information storage unit to temporarily store the plurality of the erase block addresses.

10. The memory system of claim 6, wherein the semiconductor memory device comprises:
a memory cell array having a plurality of memory cells; and
a control logic configured to control the erase operation of the memory cell array.

11. The memory system of claim 8, wherein the controller further configured to control the semiconductor memory device to perform a program operation after the semiconductor memory device completes the erase operation.

12. The memory system of claim 7, wherein the controller further configured to compare the plurality of the erase block addresses stored in the erase block information storage unit with a program block address received with the program operation request, and when a block involved in the program block address is same as a block involved in any one of the plurality of the erase block addresses, controls the semiconductor memory device to perform the erase operation.

13. A method of operating a memory system, the method comprising:
receiving an erase operation request and an erase block information corresponding to the erase operation from a host;
storing the erase block information;
receiving a program operation request and a program block information corresponding to the program operation from the host;
performing an erase operation when the erase block information is equal to the program block information; and
performing a program operation after the erase operation is completed.

14. The method of claim 13,
wherein the erase block information is compared with the program block information corresponding to the program operation before the erase operation is performed, and
when a block address involved in the erase block information is same as a block address involved in the program block information, the erase operation is performed.

15. The method of claim 13, wherein after the erase block information is stored, when the number of erase blocks corresponding to the erase block information is larger than a predetermined block number, the erase operation is performed.

16. The method of claim 15, wherein when the number of erase blocks corresponding to the in erase block information is smaller than the predetermined block number, the erase operation is kept on hold.

* * * * *